(12) United States Patent
Watanabe et al.

(10) Patent No.: US 11,545,437 B2
(45) Date of Patent: Jan. 3, 2023

(54) SEMICONDUCTOR DEVICE AND MANUFACTURING METHOD THEREOF

(71) Applicant: Kioxia Corporation, Minato-ku (JP)

(72) Inventors: Takashi Watanabe, Yokkaichi (JP); Yasuhito Yoshimizu, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 28 days.

(21) Appl. No.: 17/004,345

(22) Filed: Aug. 27, 2020

(65) Prior Publication Data
US 2021/0074643 A1 Mar. 11, 2021

(30) Foreign Application Priority Data
Sep. 6, 2019 (JP) .............................. JP2019-163301

(51) Int. Cl.
| | |
|---|---|
| *H01L 27/11548* | (2017.01) |
| *H01L 27/11575* | (2017.01) |
| *H01L 23/538* | (2006.01) |
| *H01L 27/11556* | (2017.01) |
| *G11C 5/02* | (2006.01) |
| *H01L 21/768* | (2006.01) |
| *H01L 27/11582* | (2017.01) |

(52) U.S. Cl.
CPC .......... *H01L 23/5384* (2013.01); *G11C 5/025* (2013.01); *H01L 21/76802* (2013.01); *H01L 23/5386* (2013.01); *H01L 27/11556* (2013.01); *H01L 27/11582* (2013.01)

(58) Field of Classification Search
CPC ......... H01L 27/11556; H01L 27/11582; H01L 27/11573; H01L 27/11575; H01L 23/5386; H01L 27/11548; H01L 27/1575
See application file for complete search history.

(56) References Cited

U.S. PATENT DOCUMENTS

| | | | |
|---|---|---|---|
| 7,847,334 B2 | 12/2010 | Katsumata et al. | |
| 7,952,136 B2 | 5/2011 | Kito et al. | |
| (Continued) | | | |

FOREIGN PATENT DOCUMENTS

| | | |
|---|---|---|
| JP | 2008-192857 A | 8/2008 |
| JP | 2008-244485 A | 10/2008 |
| (Continued) | | |

*Primary Examiner* — Sarah K Salerno
(74) *Attorney, Agent, or Firm* — Oblon, McClelland, Maier & Neustadt, L.L.P.

(57) ABSTRACT

A semiconductor device according to one embodiment includes a substrate, a stacked body including conductive layers and insulating layers alternately stacked on the substrate, and first contact plugs individually connected to the conductive layers on an end of the stacked body. The semiconductor device includes, on the substrate, a lower layer three-dimensional structure including any of a lower layer inclined structure continuously inclined upward with respect to a flat surface of the substrate, a lower layer stepped structure inclined upward in a stepwise manner with respect to the flat surface, and a lower layer composite stepped structure in which planes parallel to the flat surface and slopes inclined upward with respect to the flat surface are alternately continuous. At least some of terrace regions being connection regions to the first contact plugs on top surfaces of the conductive layers are located on the lower layer three-dimensional structure.

7 Claims, 23 Drawing Sheets

(56) References Cited

U.S. PATENT DOCUMENTS

| | | |
|---|---|---|
| 8,284,601 B2 | 10/2012 | Son et al. |
| 8,363,481 B2 | 1/2013 | Kidoh et al. |
| 2009/0001419 A1 | 1/2009 | Han et al. |
| 2014/0061776 A1* | 3/2014 | Kwon ............... H01L 27/11575 |
| | | 257/329 |
| 2015/0076579 A1 | 3/2015 | Tsuji et al. |
| 2018/0226424 A1* | 8/2018 | Shin ................ H01L 27/11582 |
| 2020/0357801 A1* | 11/2020 | Chen ................ H01L 27/10844 |

FOREIGN PATENT DOCUMENTS

| | | |
|---|---|---|
| JP | 2011-49561 A | 3/2011 |
| JP | 4691124 B2 | 6/2011 |
| JP | 5100080 B2 | 12/2012 |
| JP | 2015-56642 A | 3/2015 |
| JP | 6092277 B2 | 3/2017 |

* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2019-163301, filed on Sep. 6, 2019; the entire contents of which are incorporated herein by reference.

FIELD

Embodiments of the present invention relate to a semiconductor device and a manufacturing method thereof.

BACKGROUND

A three-dimensional stacked semiconductor memory as an example of semiconductor devices has a stacked body in which conductive layers functioning as word lines and insulating layers are stacked in a three-dimensional manner. Ends of the stacked body are generally formed in a stepwise manner to be connected to contact plugs.

DETAILED DESCRIPTION

Embodiments will now be explained with reference to the accompanying drawings. The present invention is not limited to the embodiments.

A semiconductor device according to one embodiment includes a substrate, a stacked body including a plurality of conductive layers and a plurality of insulating layers alternately stacked on the substrate, and a plurality of first contact plugs individually connected to the conductive layers on an end of the stacked body. The semiconductor device includes, on the substrate, a lower layer three-dimensional structure including any of a lower layer inclined structure continuously inclined upward with respect to a flat surface of the substrate, a lower layer stepped structure inclined upward in a stepwise manner with respect to the flat surface, and a lower layer composite stepped structure in which planes parallel to the flat surface and slopes inclined upward with respect to the flat surface are alternately continuous. At least some of terrace regions being connection regions to the first contact plugs on top surfaces of the conductive layers are located on the lower layer three-dimensional structure.

First Embodiment

Figure 1:
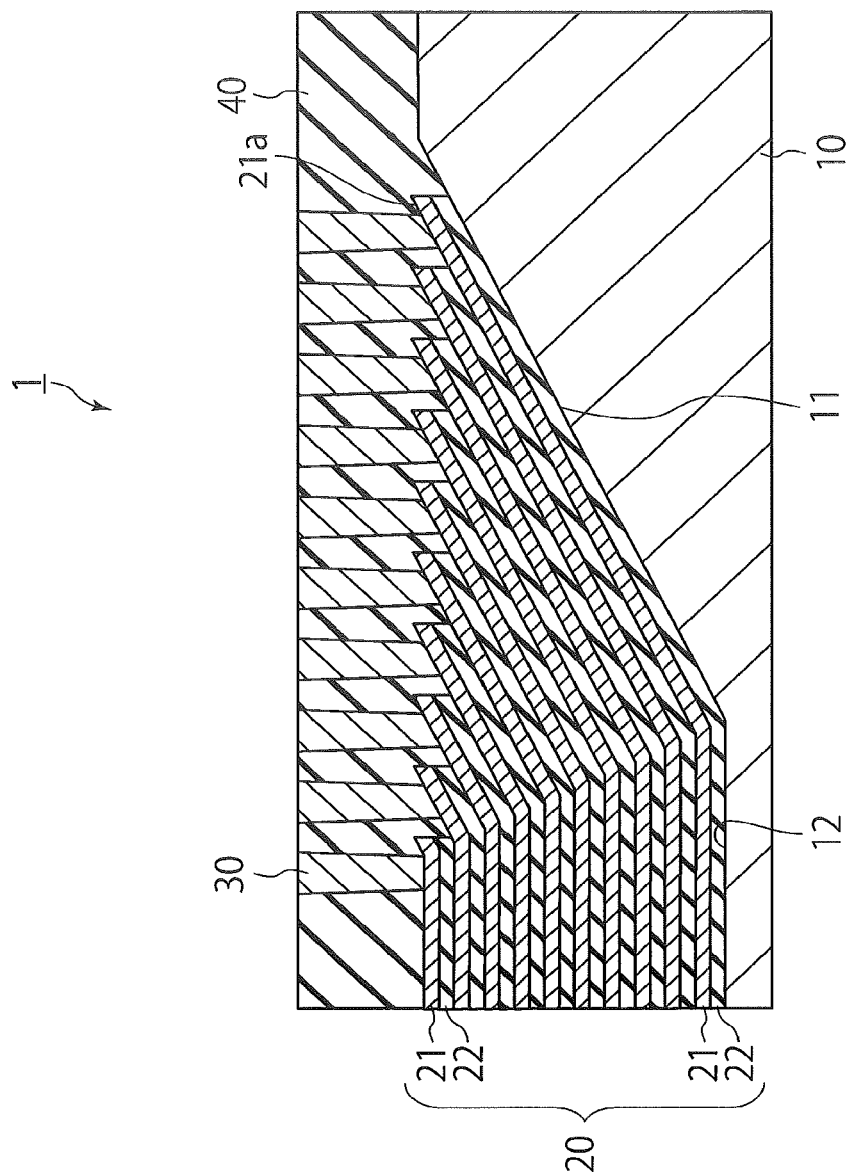
FIG. 1 is a sectional view illustrating a structure of relevant parts of a semiconductor device according to a first embodiment.

FIG. 1 is a sectional view illustrating a structure of relevant parts of a semiconductor device according to a first embodiment. A semiconductor device 1 illustrated in FIG. 1 includes a substrate 10, a stacked body 20, and a plurality of contact plugs 30.

The substrate 10 is, for example, a silicon substrate. A lower layer inclined structure 11 is formed on the substrate 10. In the present embodiment, the lower layer inclined structure 11 is an inclined surface continuously inclined upward with respect to a flat surface 12 of the substrate 10.

The stacked body 20 is located on the substrate 10. A plurality of conductive layers 21 and a plurality of insulating layers 22 are alternately stacked in the stacked body 20. Each of the conductive layers 21 functions as a word line. The conductive layers 21 are insulated from each other by the insulating layers 22. A terrace region 21a is formed at each end of the conductive layers 21. The terrace regions 21a are connection regions to the contact plugs 30 and are formed on the lower layer inclined structure 11 described above.

The contact plugs 30 are individually connected to the conductive layers 21 in the terrace regions 21a. The contact plugs 30 are insulated from each other by an upper layer insulating film 40.

A manufacturing method of the semiconductor device according to the present embodiment is explained below with reference to FIGS. 2 to 11.

Figure 2:
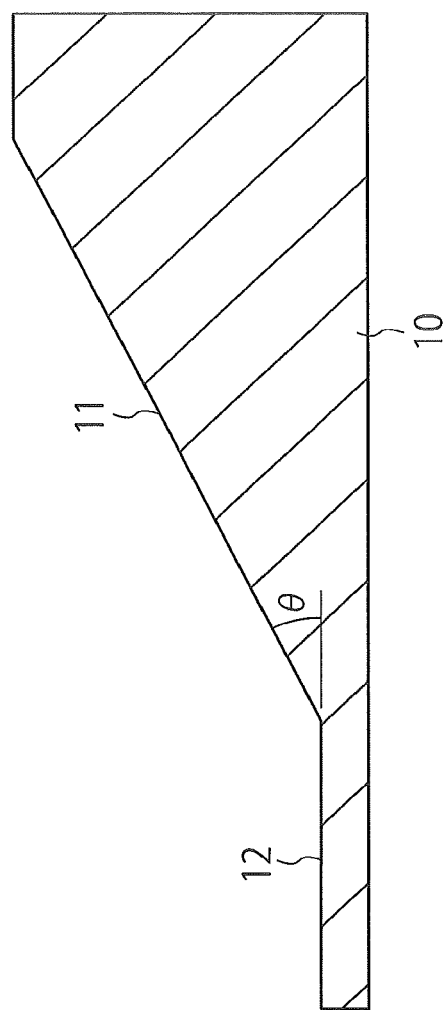
FIG. 2 is a sectional view illustrating a forming process of a lower layer inclined structure.

First, the lower layer inclined structure 11 that is inclined at any inclination angle θ with respect to the flat surface 12 is formed on one surface of the substrate 10 as illustrated in FIG. 2. The lower layer inclined structure 11 can be formed, for example, using a gray scale lithography technique and a dry etching technique. The inclination angle θ is desirably set to cause the aspect ratio of the lower layer inclined structure 11 to be close to the ratio between the pitch of the conductive layers 21 and the length of the terrace regions 21a. This enables a difference in the depths of the contact plugs 30 to be smaller.

Figure 3:
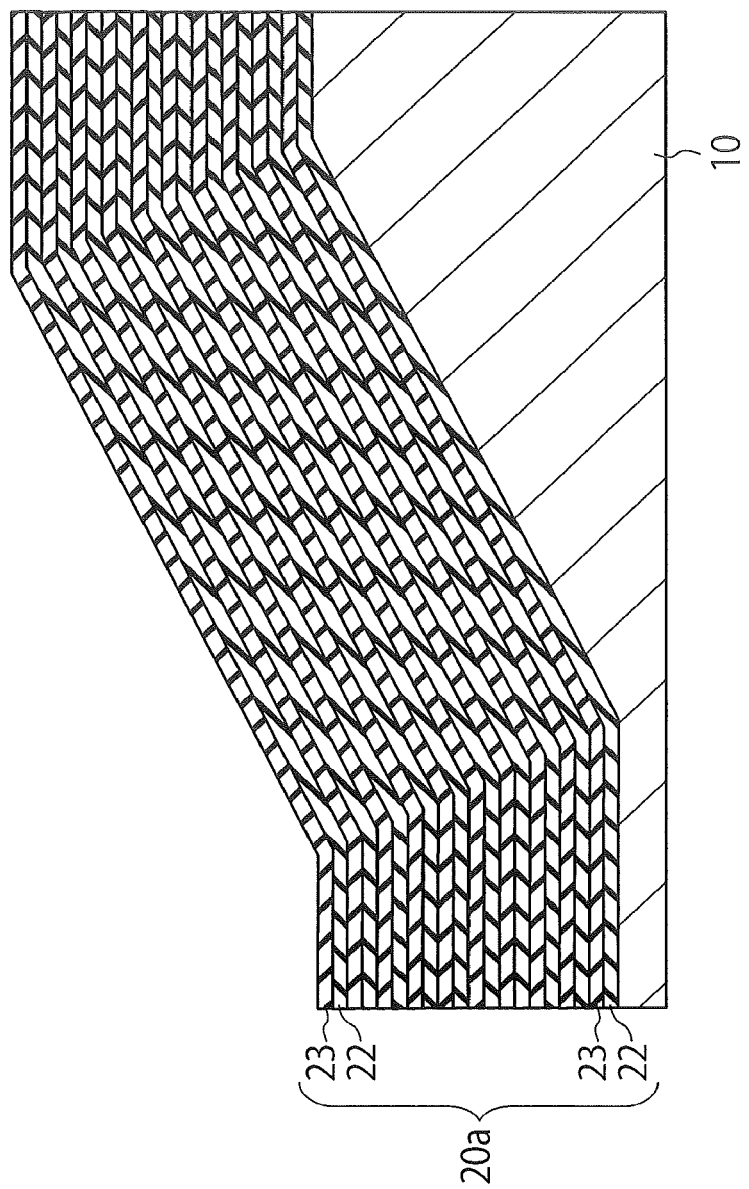
FIG. 3 is a sectional view illustrating a forming process of a stacked body.

Next, a stacked body 20a is formed on the substrate 10 as illustrated in FIG. 3. The stacked body 20a can be formed by alternately stacking sacrifice layers 23 (first layers) and insulating layers 22 (second layers). The sacrifice layers 23 are, for example, silicon nitride films and the insulating layers 22 are, for example, silicon dioxide films.

Figure 4:
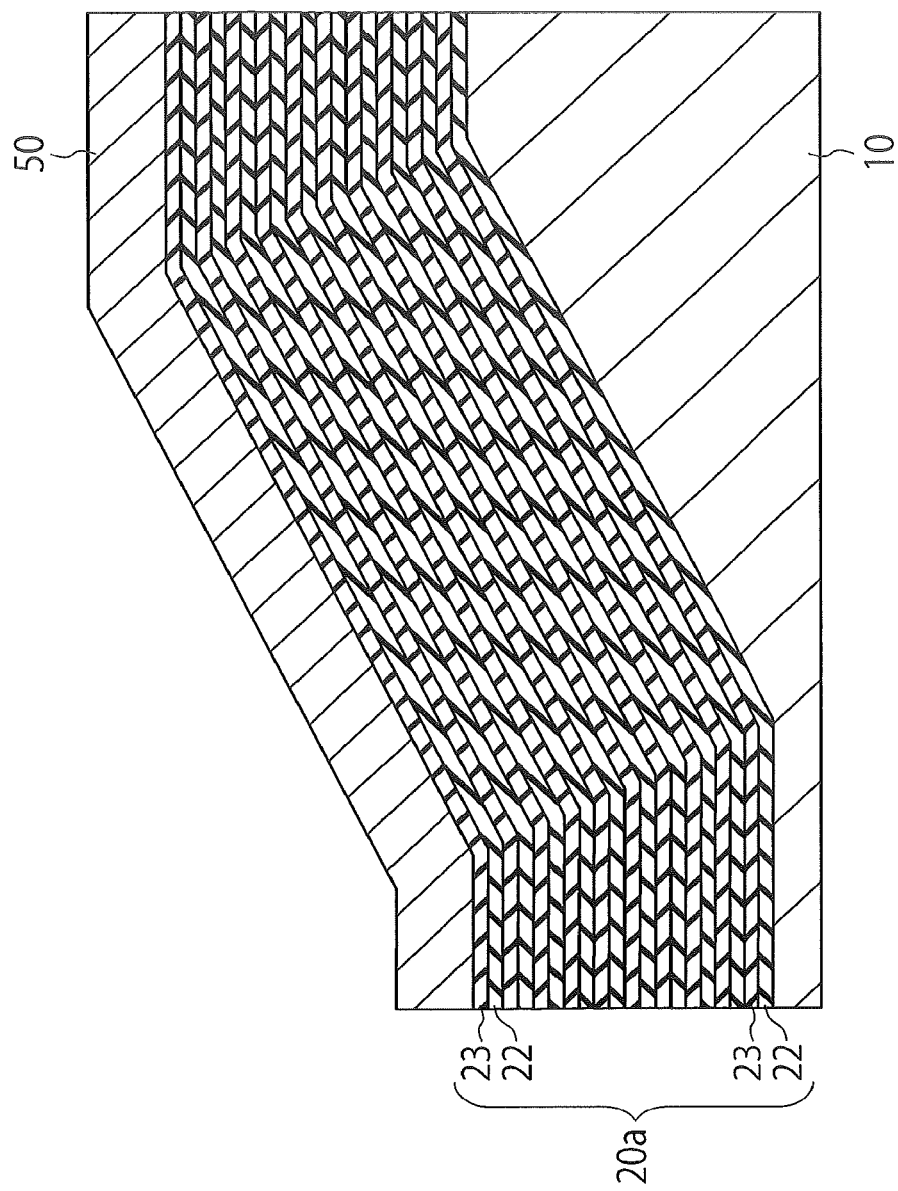
FIG. 4 is a sectional view illustrating a forming process of a mask material.

Next, a mask material 50 is formed on the stacked body 20a as illustrated in FIG. 4. The mask material 50 can be a photoresist composed of an organic substance or a hard mask material composed of an insulating film or a metallic film.

Figure 5:
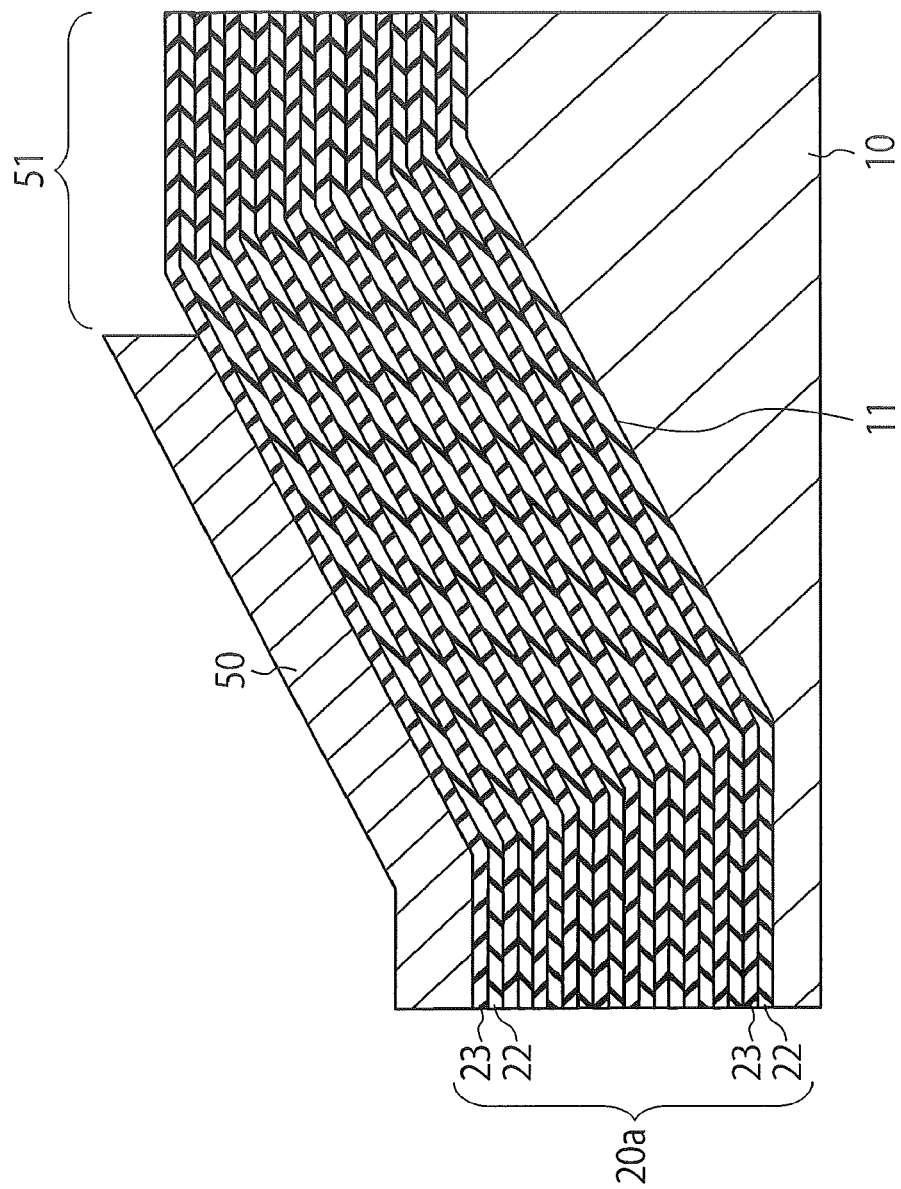
FIG. 5 is a sectional view illustrating a forming process of an opening on the mask material.

Subsequently, an opening 51 is formed on the mask material 50 as illustrated in FIG. 5. The opening 51 exposes a portion of the uppermost sacrifice layer 23, which is formed on the top of the lower layer inclined structure 11.

Figure 6:
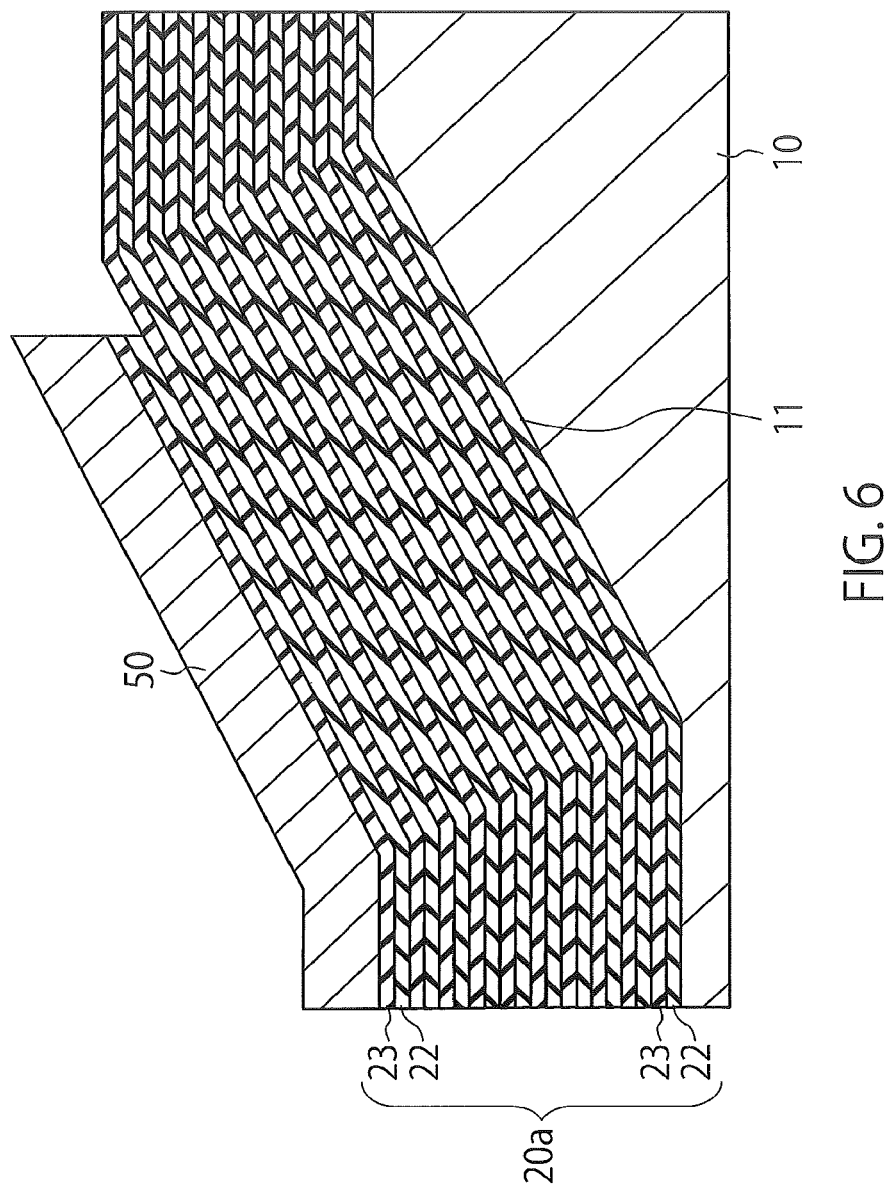
FIG. 6 is a sectional view illustrating an etching process of a sacrifice layer and an insulating layer.

Next, the portion of the uppermost sacrifice layer 23 exposed from the opening 51 and a portion of the insulating layer 22 formed under the sacrifice layer 23 are removed, for example, by dry etching as illustrated in FIG. 6.

Figure 7:
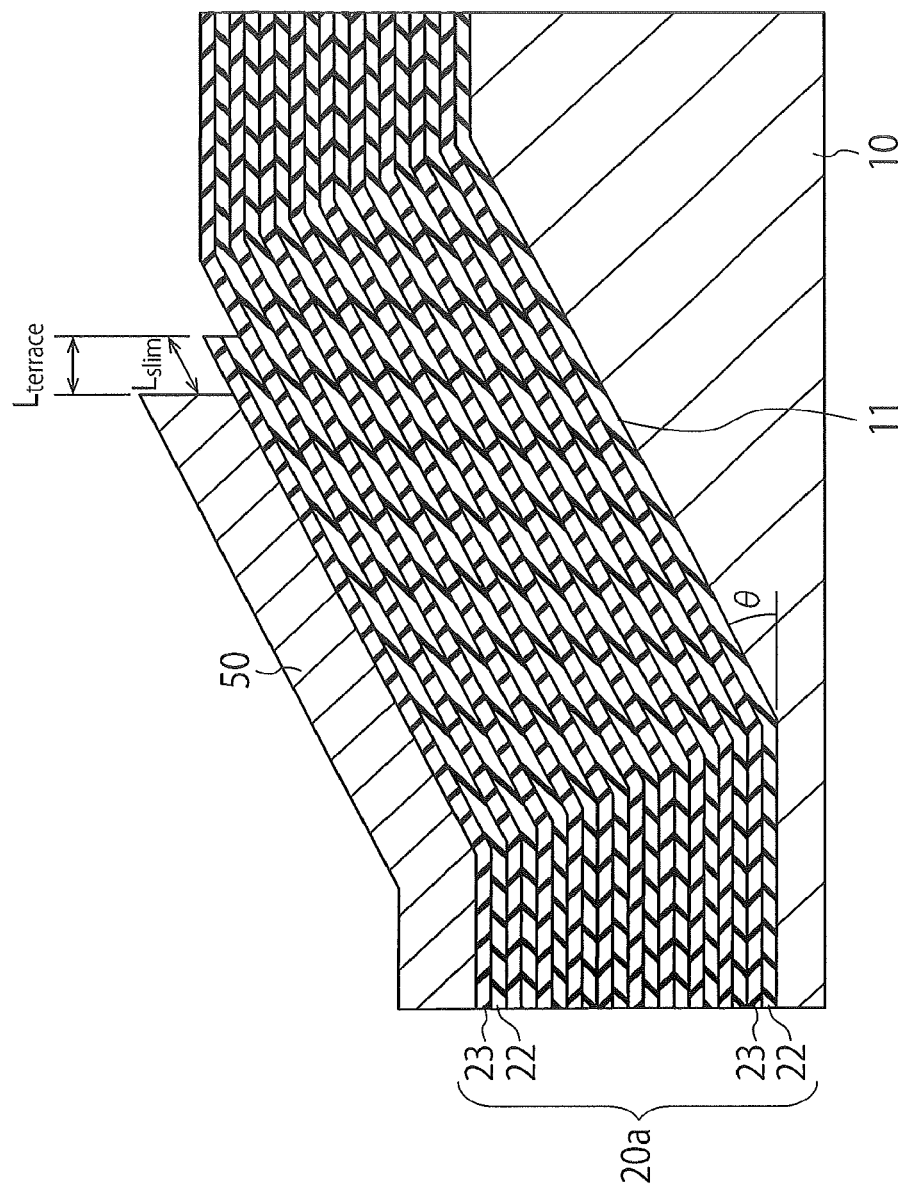
FIG. 7 is a sectional view illustrating a slimming process of an end of the mask material.

Next, an end of the mask material 50 is slimmed as illustrated in FIG. 7. Accordingly, a portion of the uppermost sacrifice layer 23 and a sacrifice layer 23 located one step lower than the uppermost sacrifice layer 23 are exposed on the lower layer inclined structure 11. In the present embodiment, a slimming length Lslim is determined so as to obtain a desired terrace length Lterrace and the end of the mask material 50 is retracted. Since the slimming of the mask material 50 progresses along the lower layer inclined structure 11, the formed terrace length Lterrace has the following relation with the slimming length Lslim of the mask material 50 and the inclination angle θ of the lower layer inclined structure 11.

$$L\text{terrace} = L\text{slim} \times \cos\theta \tag{1}$$

Figure 8:
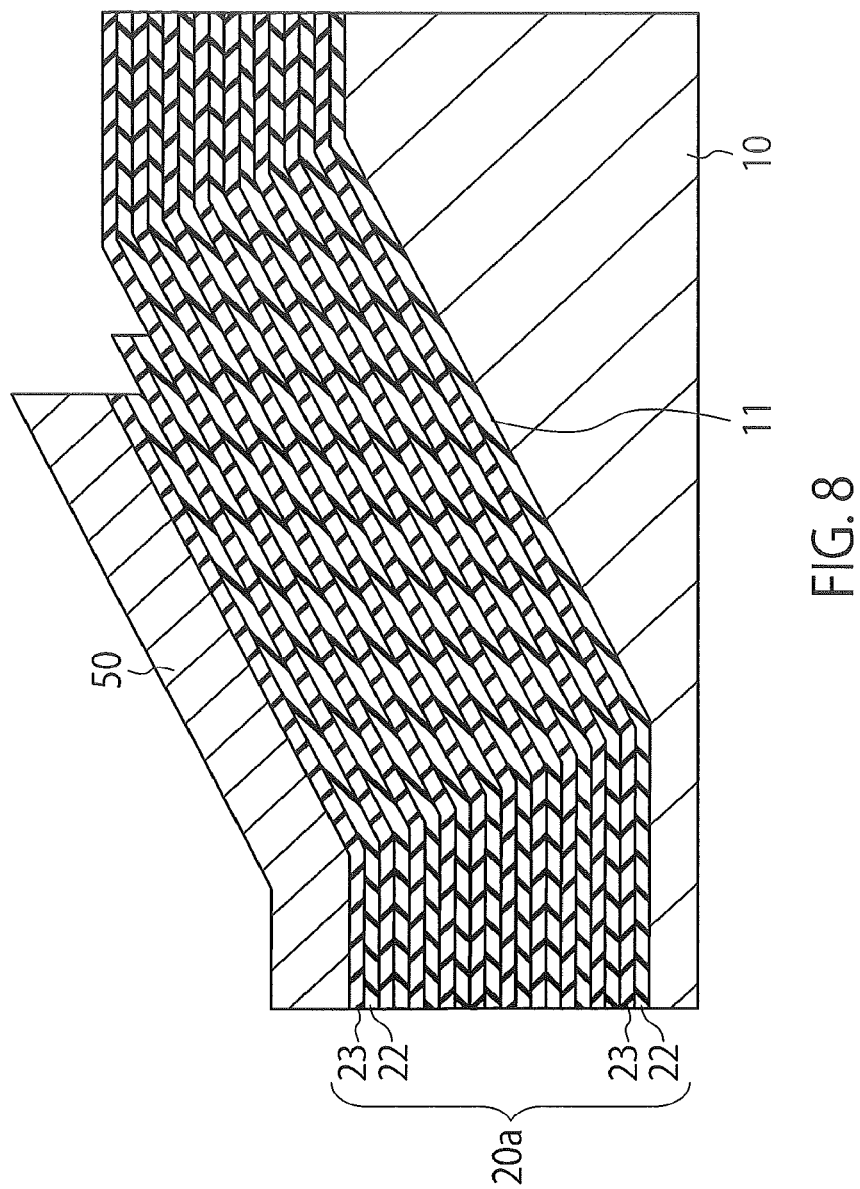
FIG. 8 is a sectional view illustrating an etching process of a sacrifice layer and an insulating layer after slimming a mask material.

Next, the portion of the uppermost sacrifice layer 23 and a portion of the insulating layer 22 formed under the uppermost sacrifice layer 23 are removed, for example, by dry etching as illustrated in FIG. 8. A portion of a sacrifice layer 23 formed under this insulating layer 22 and a portion of an insulating layer 22 formed under this sacrifice layer 23 are also removed.

Figure 9:
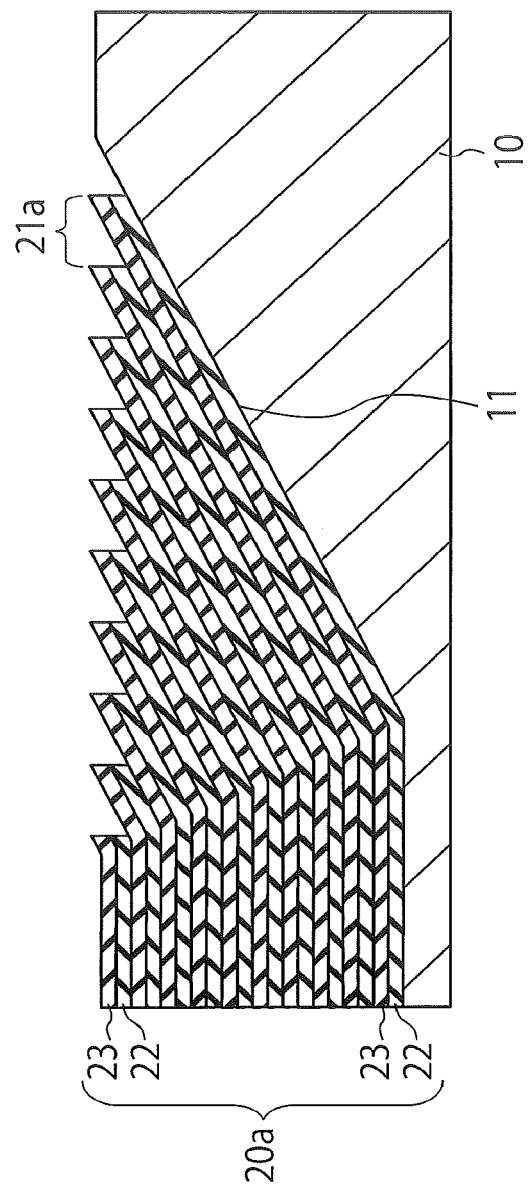
FIG. 9 is a sectional view illustrating a forming process of a terrace region.

When slimming of the end of the mask material 50 and removal of the sacrifice layers 23 and the insulating layers 22 are thereafter repeated, the terrace regions 21a are formed on the lower layer inclined structure 11 as illustrated in FIG. 9.

Figure 10:
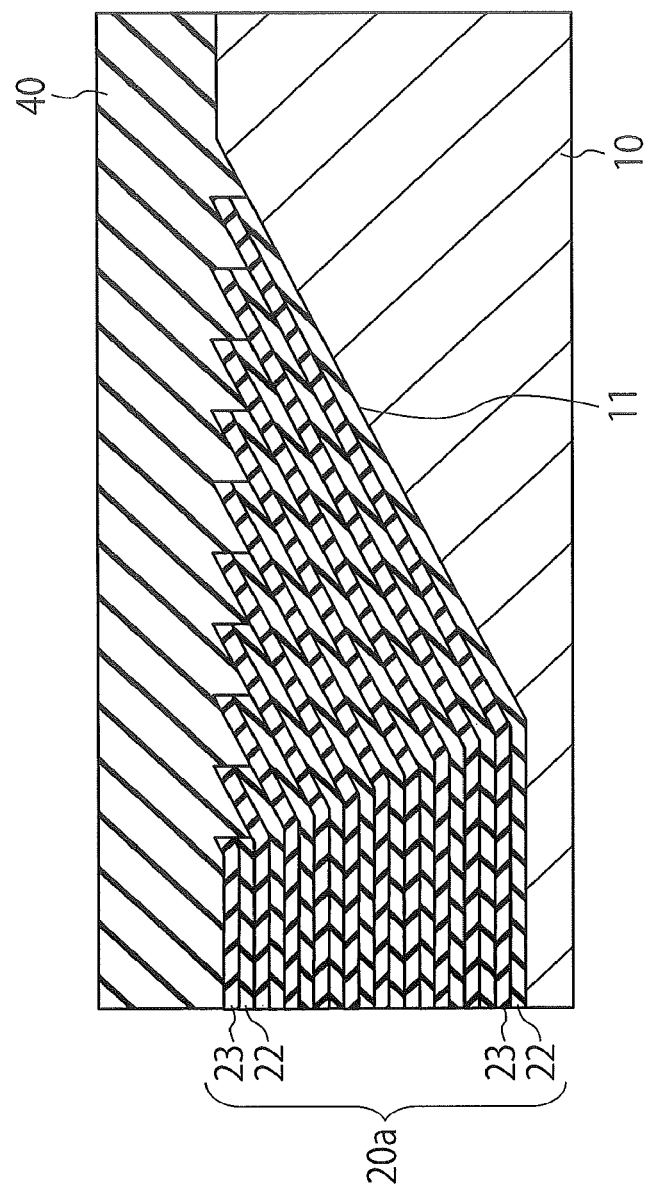
FIG. 10 is a sectional view illustrating a forming process of an upper layer insulating film.

Next, the upper layer insulating film 40 is formed on the stacked body 20a as illustrated in FIG. 10. The upper layer insulating film 40 is, for example, a silicon dioxide film.

Figure 11:
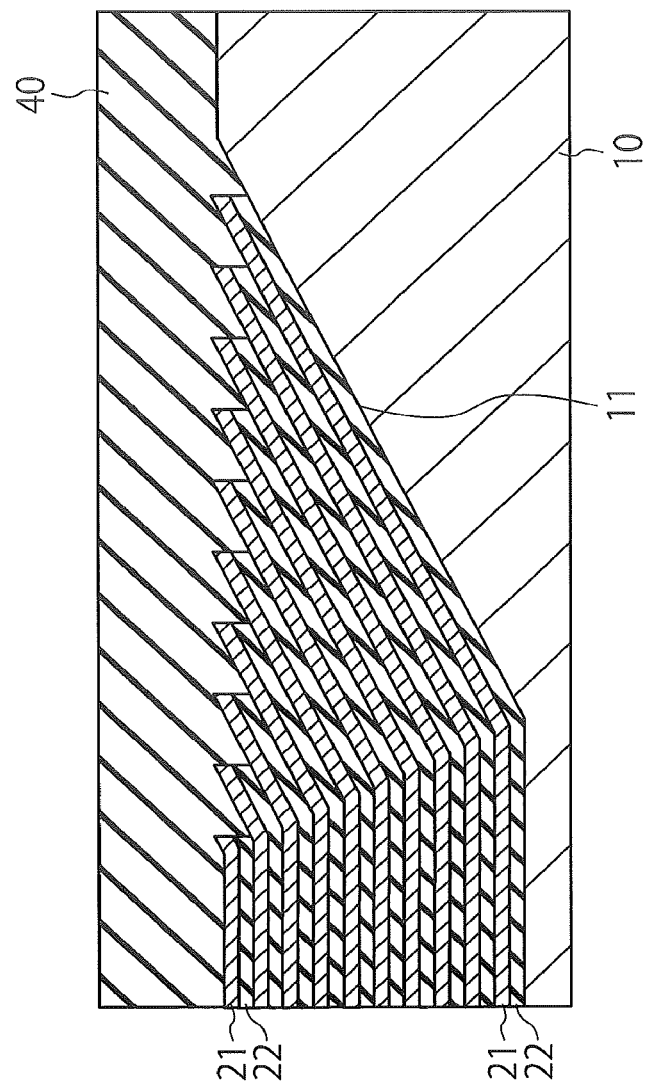
FIG. 11 is a sectional view illustrating a process of replacing sacrifice layers with conductive layers.

Next, the sacrifice layers 23 are replaced with the conductive layers 21 as illustrated in FIG. 11. In this case, the sacrifice layers 23 are removed and the conductive layers 21 are formed at places from which the sacrifice layers 23 have been removed. The conductive layers 21 are, for example, tungsten films.

Finally, the contact plugs 30 are formed to be connected to the conductive layers 21 in the terrace regions 21a, respectively, as illustrated in FIG. 1. The contact plugs 30 are, for example, tungsten films.

Comparative Example

Figure 12:
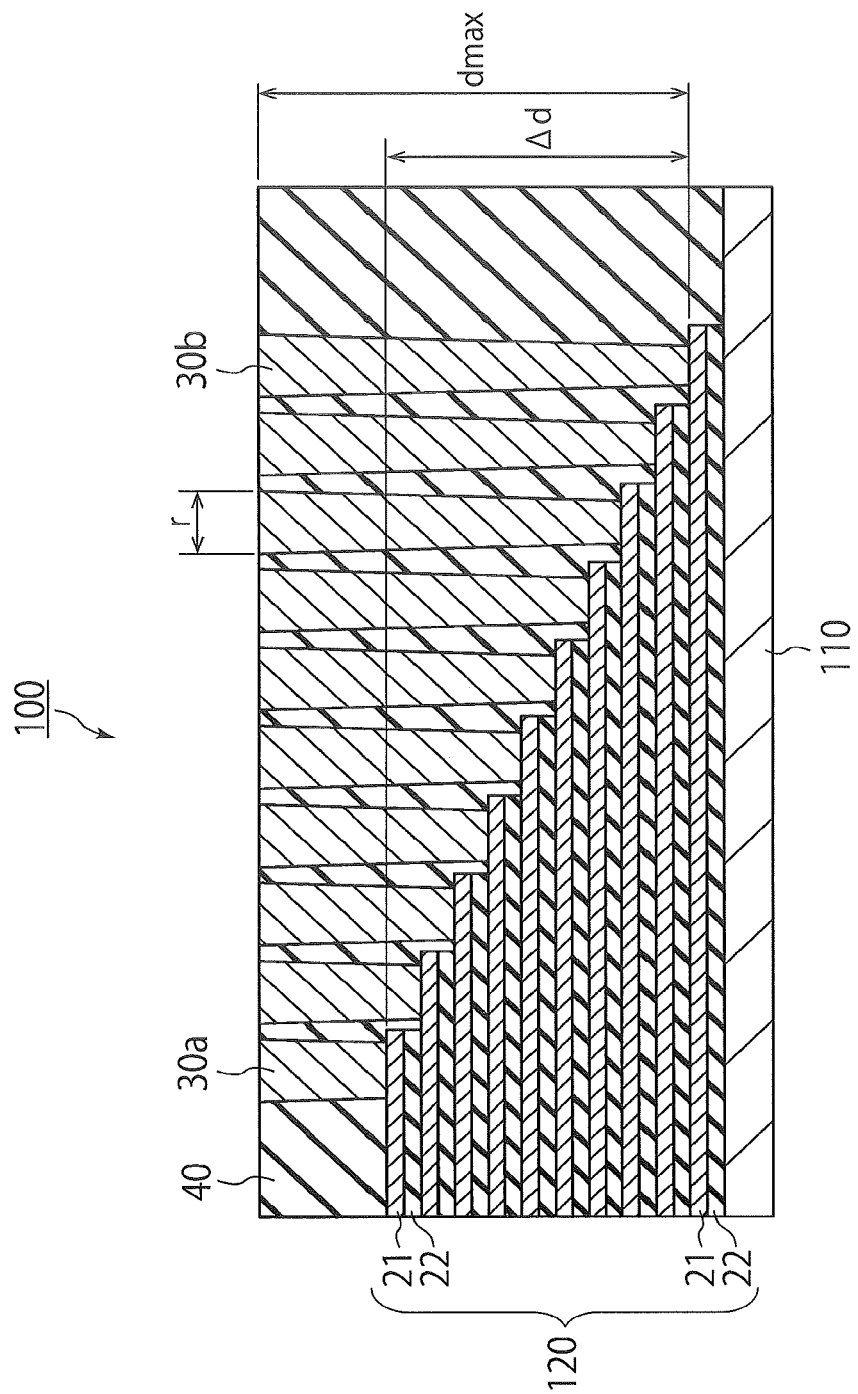
FIG. 12 is a sectional view illustrating a structure of relevant parts of a semiconductor device according to a comparative example.

FIG. 12 is a sectional view illustrating a structure of relevant parts of a semiconductor device according to a comparative example. In a semiconductor device 100 illustrated in FIG. 12, the lower layer inclined structure 11 described above is not formed on the entire top surface of a substrate 110. A stacked body 120 is formed on the substrate 110. In the stacked body 120, a plurality of conductive layers 21 and a plurality of insulating layers 22 are alternately stacked similarly in the semiconductor device 1 described above.

In this comparative example, ends of the stacked body 120 are formed in a stepwise manner inclined downward in a stepwise manner from the uppermost layer to the lowermost layer. Accordingly, if the number of the stacked conductive layers 21 is large, a difference Δd in the depths between a contact plug 30a connected to the uppermost conductive layer 21 and a contact plug 30b connected to the lowermost conductive layer 21 is considerably large. In this case, overetching is likely to occur at the time of forming the contact plug 30a. At the time of forming the contact plug 30b, it is likely that the corresponding contact hole does not reach the lowermost conductive layer 21 and that a connection failure between the contact plug 30b and the conductive layer 21 occurs.

When the number of the conductive layers 21 is large, a depth dmax of the contact plug 30b is considerably large. In this case, problems such as increase in the electrical resistance, increase in the parasitic capacitance between contact plugs, and decrease in the productivity due to prolonged time of the etching process are concerned. Further, if a top diameter r of the contact plugs is enlarged to ensure the depth of the contact plug 30b, there is concern that the terrace regions 21a cannot be downscaled.

In contract thereto, according to the embodiment described above, the terrace regions 21a of the conductive layers 21 are formed on the lower layer inclined structure 11 of the substrate 10. Therefore, the difference Δd in the depths of the contact plugs 30 can be set to be equal to or smaller than half of the height of the stacked body 20. Since the depth dmax of the contact plug 30 connected to the lowermost conductive layer 21 is also reduced, technical problems such as a connection failure of the contact plugs 30, increase in the resistance, and increase in the parasitic capacitance can also be overcome.

Further, the productivity can be improved due to shortening of the processing time of etching. Since the top diameter r of the contact plugs 30 can be reduced, the chip area can be decreased by downscaling of the terrace regions 21a. Furthermore, the terrace regions 21a are formed using lithography and dry etching, so that misalignment of the connection regions of the contact plugs 30 can be prevented and the connection regions sufficient for connection can be formed.

Second Embodiment

Figure 13:
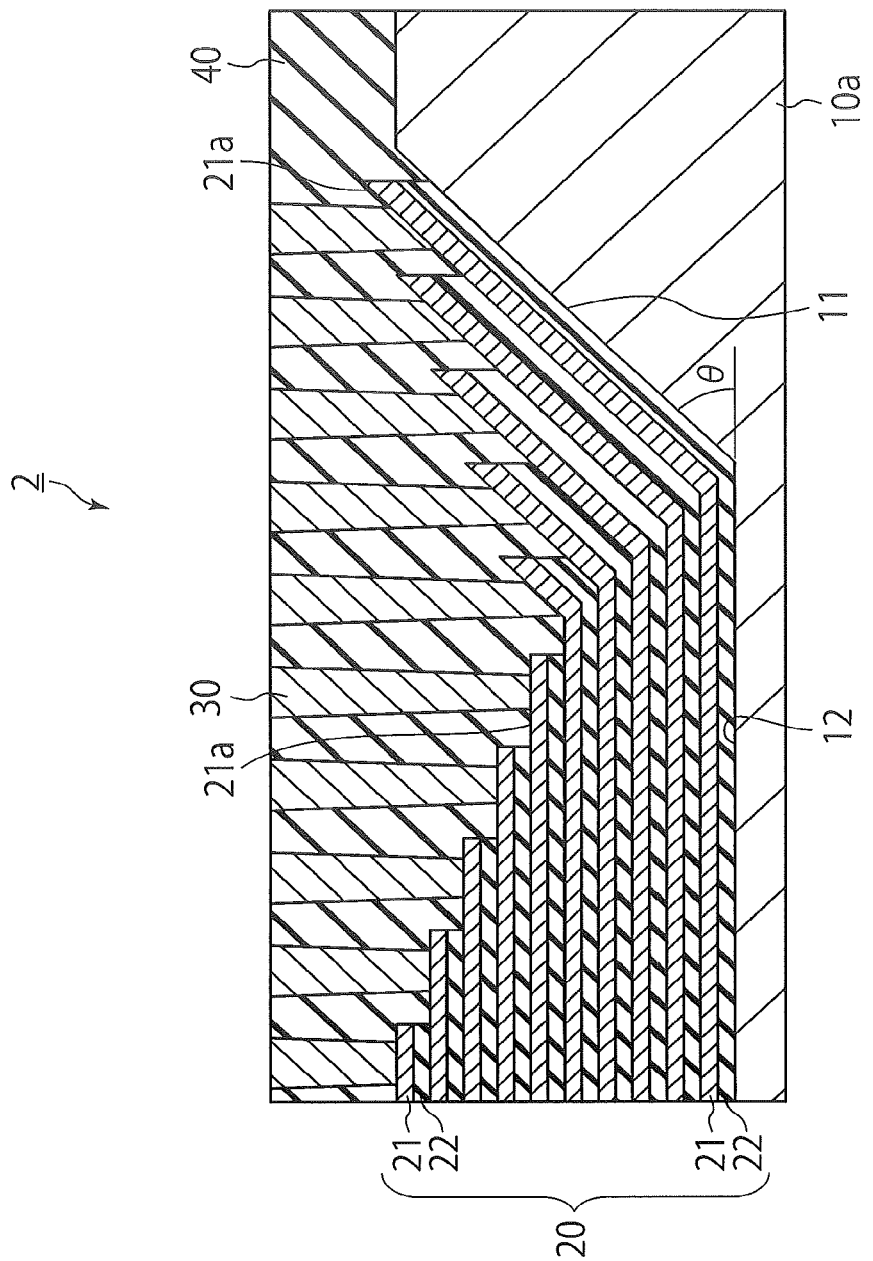
FIG. 13 is a sectional view illustrating a structure of relevant parts of a semiconductor device according to a second embodiment.

FIG. 13 is a sectional view illustrating a structure of relevant parts of a semiconductor device according to a second embodiment. Constituent elements identical to those of the semiconductor device 1 according to the first embodiment described above are denoted by like reference signs and detailed descriptions thereof are omitted.

In a semiconductor device 2 according to the present embodiment, the terrace regions 21a of the conductive layers 21 are formed not only on the lower layer inclined structure 11 formed on a substrate 10a but also on the flat surface 12 of the substrate 10a as illustrated in FIG. 13.

In the present embodiment, the lower layer inclined structure 11 is formed on the surface of the substrate 10a being a silicon substrate using, for example, a crystal orientation anisotropic wet etching technique with an alkali aqueous solution. For example, an etchant such as potassium hydroxide, tetramethylammonium hydroxide (TMAH), or ethylenediamine pyrocatechol (EDP) is used as the alkali aqueous solution. This enables the lower layer inclined structure 11 composed of a (111) plane (facet) of silicon crystal to be formed.

In the lower layer inclined structure 11 formed by the anisotropic wet etching, the inclination angle θ is about 55° and steep. Therefore, in a case in which all the terrace regions 21a cannot be formed on the lower layer inclined structure 11, the terrace regions 21a formed in a stair-like fashion are combined. In this case, the terrace regions 21a of a predetermined number of conductive layers 21 including the lowermost conductive layer 21 are formed on the lower layer inclined structure 11. Accordingly, as compared to the semiconductor device 100 according to the comparative example described above, the difference Δd in the depths of the contact plugs 30 can be reduced and the depth dmax of the contact plug 30 connected to the lowermost conductive layer 21 can also be decreased.

In the present embodiment, the lower layer inclined structure 11 is formed by wet etching. Therefore, the lower layer inclined structure 11 can be formed at lower cost than in the first embodiment in which dry etching is used.

Third Embodiment

Figure 14:
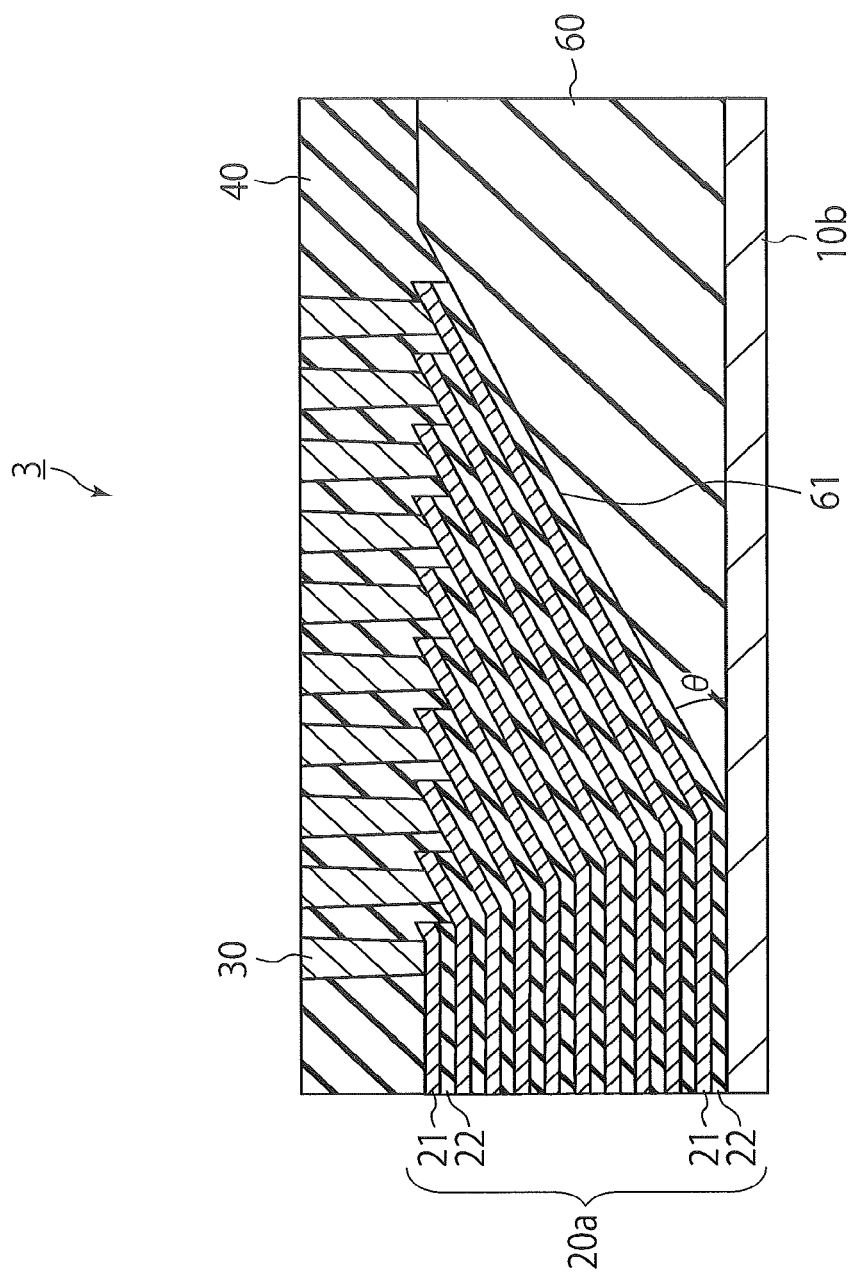
FIG. 14 is a sectional view illustrating a structure of relevant parts of a semiconductor device according to a third embodiment.

FIG. 14 is a sectional view illustrating a structure of relevant parts of a semiconductor device according to a third embodiment. Constituent elements identical to those of the semiconductor device 1 according to the first embodiment described above are denoted by like reference signs and detailed descriptions thereof are omitted.

In a semiconductor device 3 according to the present embodiment, the top surface of a substrate 10b is entirely a flat surface as illustrated in FIG. 14. A lower layer insulating film 60 is formed on a part of the flat surface. A lower layer inclined structure 61 is formed on the surface of the lower layer insulating film 60. The lower layer inclined structure 61 has a slope continuously inclined upward with respect to the substrate 10b.

The lower layer insulating film 60 can be formed, for example, as a silicon dioxide film on the substrate 10b being a silicon substrate. The lower layer inclined structure 61 can be formed by a wet etching process using a resist. At this time, the adhesion between the surface of the lower layer insulating film 60 and the resist is controlled to enable formation of the lower layer inclined structure 61 with any inclination angle θ. The adhesion between the surface of the lower layer insulating film 60 and the resist can be controlled by changing the film property of the lower layer insulating film 60 or the resist, or the surface state of the lower layer insulating film 60.

According to the present embodiment explained above, similarly in the first embodiment, the difference Δd in the depths of the contact plugs 30 can be reduced and the depth of the contact plug 30 connected to the lowermost conductive layer 21 can also be decreased as compared to the semiconductor device 100 according to the comparative example.

In the present embodiment, because the lower layer inclined structure 61 is formed by wet etching, the lower layer inclined structure 61 can be formed at lower cost than in the first embodiment in which dry etching is used.

Fourth Embodiment

Figure 15:
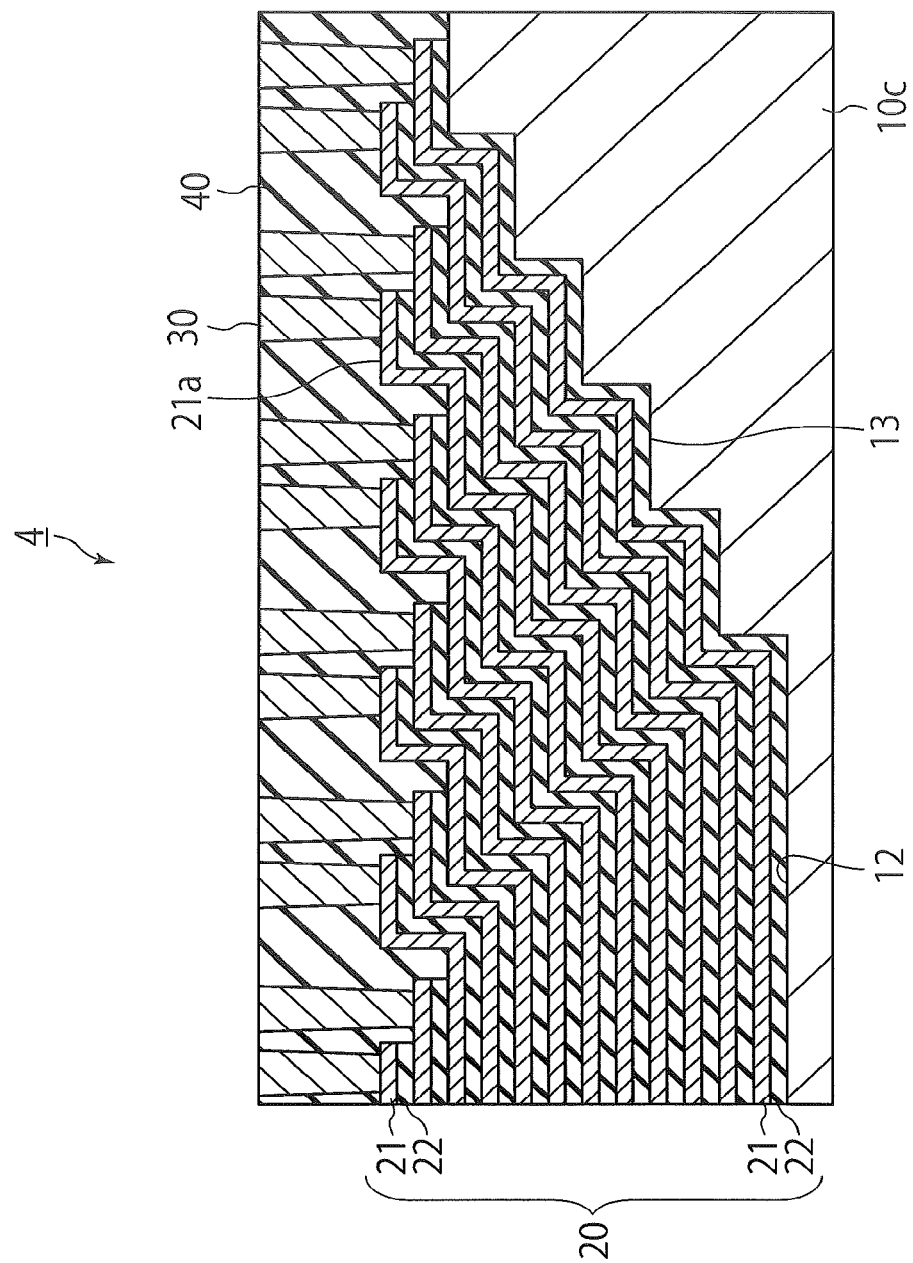
FIG. 15 is a sectional view illustrating a structure of relevant parts of a semiconductor device according to a fourth embodiment.

FIG. 15 is a sectional view illustrating a structure of relevant parts of a semiconductor device according to a fourth embodiment. Constituent elements identical to those of the semiconductor device 1 according to the first embodiment described above are denoted by like reference signs and detailed descriptions thereof are omitted.

In a semiconductor device 4 according to the present embodiment, a lower layer stepped structure 13 is formed on the surface of a substrate 10c as illustrated in FIG. 15. The lower layer stepped structure 13 is an inclined surface inclined upward in a stepwise manner with respect to the flat surface 12 of the substrate 10c. The number of steps in the inclined surface is equal to or less than half of the number of the stacked conductive layers 21.

The lower layer stepped structure 13 can be formed, for example, by dry etching the surface of the substrate 10c. A plurality of terrace regions 21a are formed in a stepwise manner on each step of the lower layer stepped structure 13.

According to the present embodiment explained above, similarly in the first embodiment, the difference Δd in the depths of the contact plugs 30 can be reduced and the depth of the contact plug 30 connected to the lowermost conductive layer 21 can also be decreased as compared to the semiconductor device 100 according to the comparative example. Further, in the present embodiment, the lower layer inclined structure 11 does not need to be formed and it is easy to stably form a lower layer three-dimensional structure.

Fifth Embodiment

Figure 16:
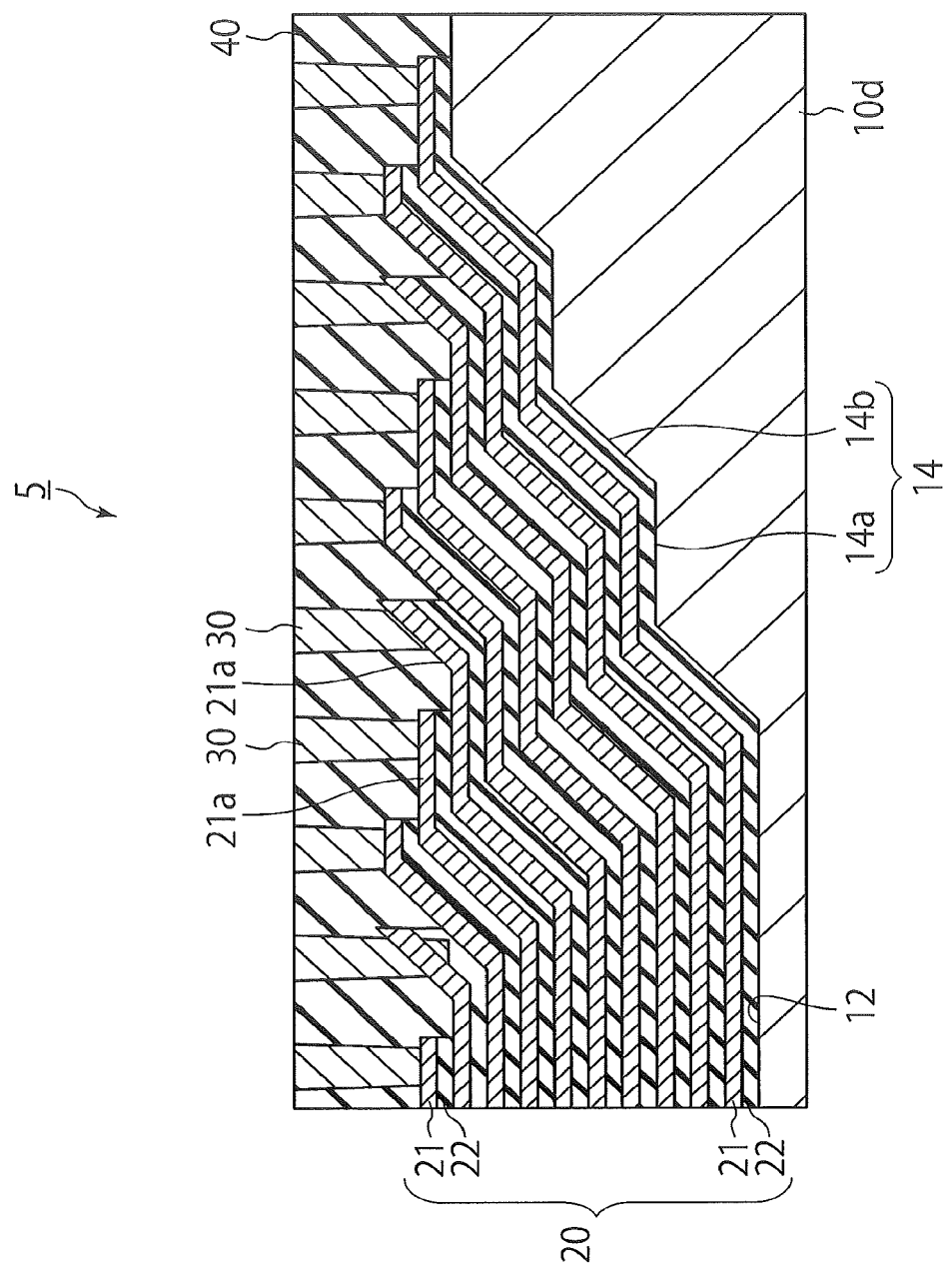
FIG. 16 is a sectional view illustrating a structure of relevant parts of a semiconductor device according to a fifth embodiment.

FIG. 16 is a sectional view illustrating a structure of relevant parts of a semiconductor device according to a fifth embodiment. Constituent elements identical to those of the semiconductor device 1 according to the first embodiment described above are denoted by like reference signs and detailed descriptions thereof are omitted.

In a semiconductor device 5 according to the present embodiment, a lower layer composite stepped structure 14 is formed on the surface of a substrate 10d. In the lower layer composite stepped structure 14, planes 14a parallel to the flat surface 12 and slopes 14b inclined upward with respect to the flat surface 12 are alternately continuous.

The lower layer composite stepped structure 14 can be formed, for example, by a combination of dry etching and crystal orientation anisotropic wet etching with an alkali aqueous solution. The terrace regions 21a are formed on the lower layer composite stepped structure 14.

According to the present embodiment explained above, similarly in the first embodiment, the difference Δd in the depths of the contact plugs 30 can be reduced and the depth of the contact plug 30 connected to the lowermost conductive layer 21 can also be decreased as compared to the semiconductor device 100 according to the comparative example.

Further, in the present embodiment, a combination of plane structures and slope structures eliminates the need of causing the inclined surface to be gentler and it is easy to stably form a lower layer three-dimensional structure.

Sixth Embodiment

Figure 17:
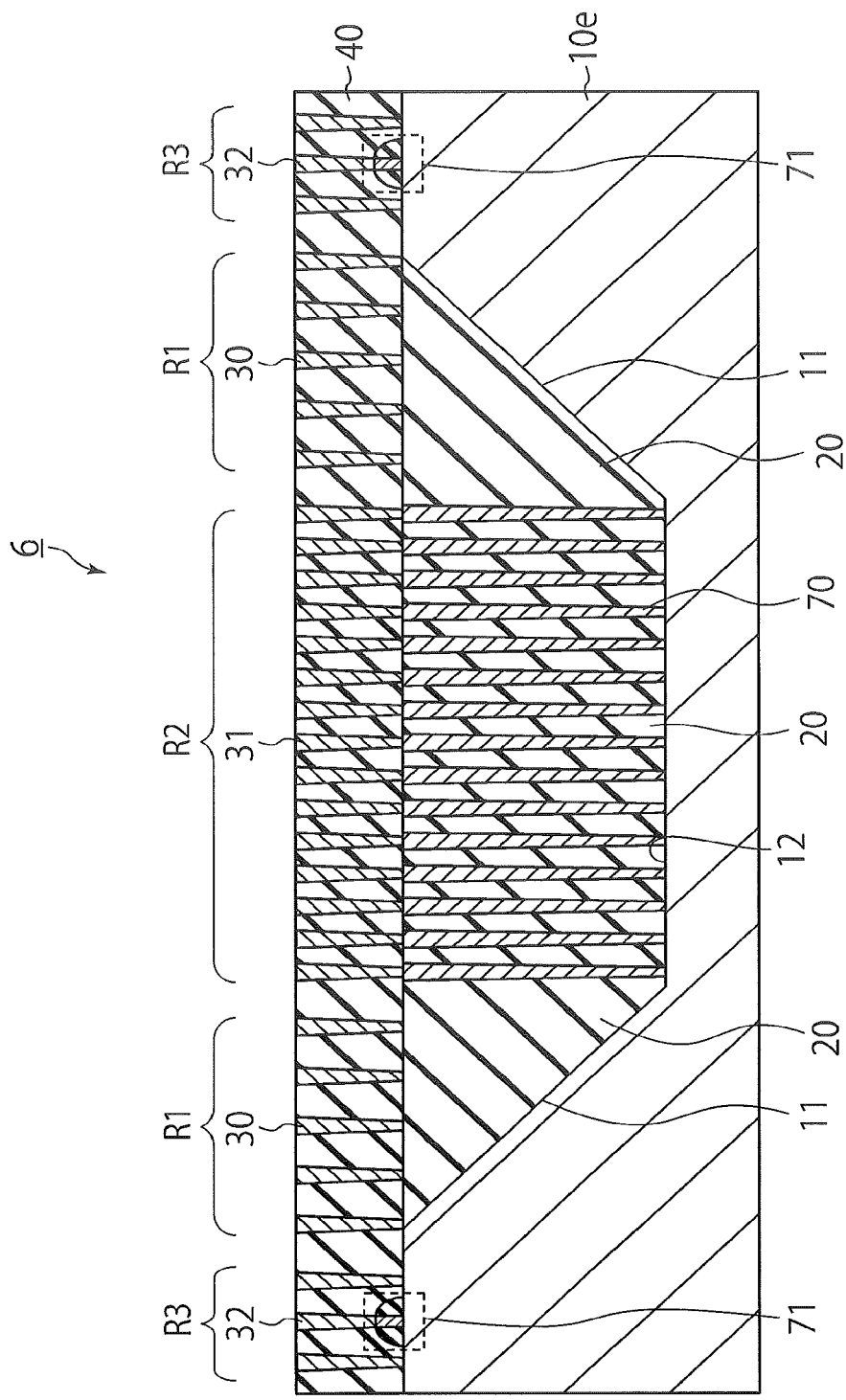
FIG. 17 is a sectional view illustrating a structure of relevant parts of a semiconductor device according to a sixth embodiment.

FIG. 17 is a sectional view illustrating a structure of relevant parts of a semiconductor device according to a sixth embodiment. Constituent elements identical to those of the semiconductor device 1 according to the first embodiment described above are denoted by like reference signs and detailed descriptions thereof are omitted.

In a semiconductor device 6 according to the present embodiment, a concave portion is formed on a substrate 10e as illustrated in FIG. 17. A lower layer three-dimensional structure including any of the lower layer inclined structure 11 explained in the first embodiment, the lower layer stepped structure 13 explained in the fourth embodiment, and the lower layer composite stepped structure 14 explained in the fifth embodiment is formed in end regions R1 of the concave portion. FIG. 17 illustrates the lower layer inclined structure 11.

Although not illustrated in FIG. 17, the terrace regions 21a of the conductive layers 21 are formed on the lower layer three-dimensional structure including the lower layer inclined structure 11. The conductive layers 21 are respectively connected to the contact plugs 30 (first contact plugs) in the terrace regions 21a.

A memory cell region R2 is formed in a central part of the concave portion. A plurality of memory films 70 are formed in the memory cell region R2. Although not illustrated in FIG. 17, the memory films 70 are each formed of a multi-layer film including, for example, a block dielectric film, a charge accumulation film, a tunnel dielectric film, and a channel film. Contact plugs 31 (second contact plugs) respectively connected to the channel films are formed on the memory films 70. Top parts of the contact plugs 31 are coplanar with top parts of the contact plugs 30. The memory films 70 and the contact plugs 31 are also provided in the semiconductor devices according to the embodiments described above and the comparative example.

The semiconductor device 6 according to the present embodiment also includes CMOS (Complementary Metal Oxide Semiconductor) circuit regions R3 on an outer side of the end regions R1. MOS transistors 71 for driving the memory films 70 are formed in the CMOS circuit regions R3. The MOS transistors 71 are connected to contact plugs 32 (third contact plugs). Top parts of the contact plugs 32 are also coplanar with the top parts of the contact plugs 30. The MOS transistors 71 and the contact plugs 32 are also provided in the semiconductor devices according to the embodiments described above and the comparative example.

The semiconductor device 6 according to the present embodiment is formed by forming the stacked body 20 and the memory films 70 according to any of the first embodiment, the second embodiment, the fourth embodiment, and the fifth embodiment, thereafter processing holes by dry etching for at least either the contact plugs 31 or the contact plugs 32 at the same time as the contact plugs 30, and simultaneously filling metallic films in the holes.

Since the depths are greatly different between the contact plug 30a connected to the uppermost conductive layer 21 and the contact plug 30b connected to the lowermost conductive layer 21 in the semiconductor device 100 according to the comparative example, it is difficult to fill metallic films in the holes and form the contact plugs 30a and 30b at the same time.

On the other hand, according to the present embodiment, the differences in the depth of the contact plugs 30 to 32 can be reduced and therefore the contact plugs can be formed at the same time. Accordingly, the process time can be shortened and the manufacturing cost can be reduced.

Seventh Embodiment

Figure 18:
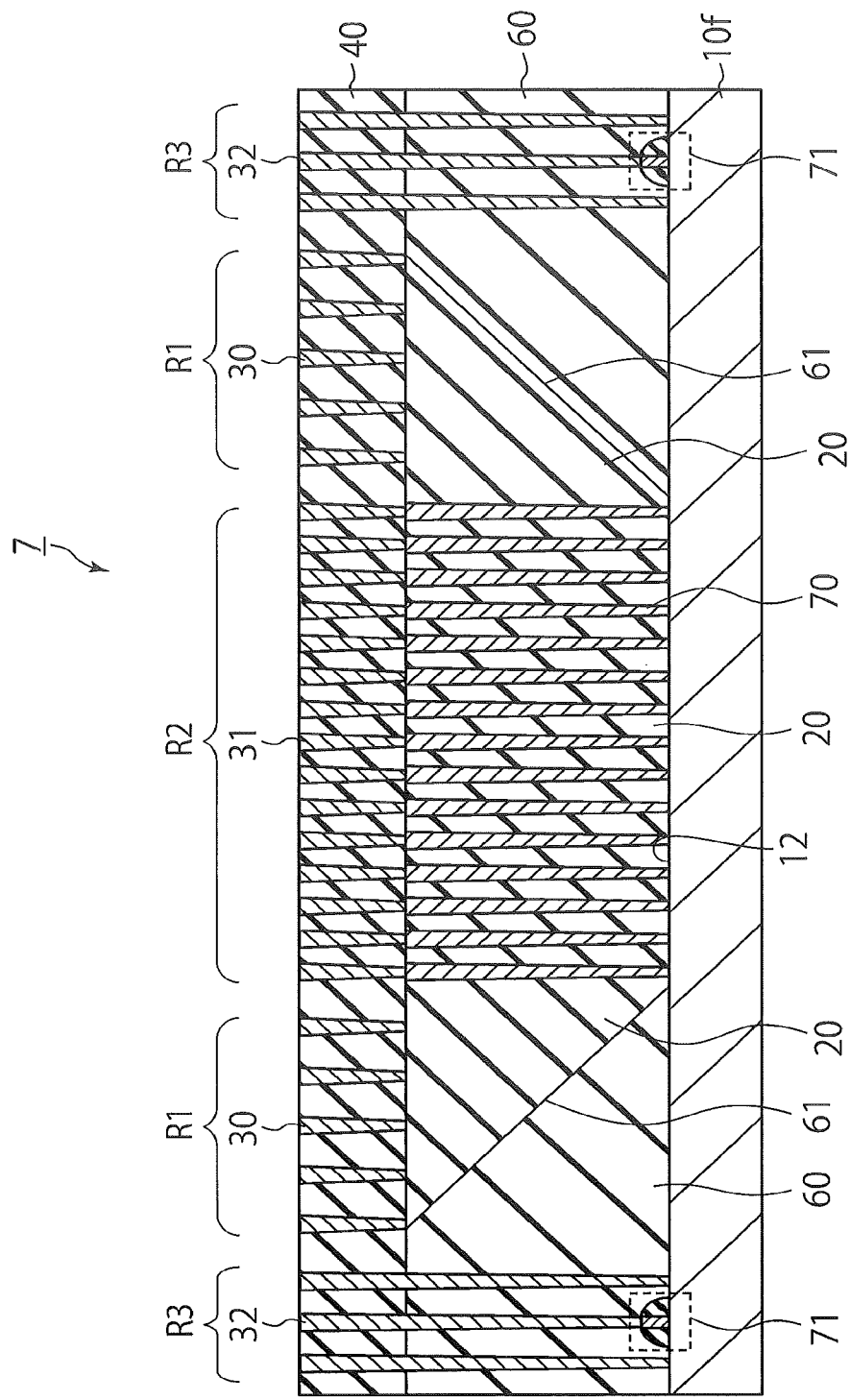
FIG. 18 is a sectional view illustrating a structure of relevant parts of a semiconductor device according to a seventh embodiment.

FIG. 18 is a sectional view illustrating a structure of relevant parts of a semiconductor device according to a seventh embodiment. In a semiconductor device 7 illustrated in FIG. 18, the lower layer insulating film 60 explained in the third embodiment is formed on a substrate 10f. The lower layer inclined structure 61 explained in the third embodiment is illustrated in the end regions R1 of the lower layer insulating film 60. A lower layer three-dimensional structure including any of the lower layer inclined structure 61, the lower layer stepped structure, and the lower layer composite stepped structure may be formed in the end regions R1, similarly in the sixth embodiment described above.

The memory films 70 are formed in a central part of a concave portion formed of the substrate 10f and the lower layer insulating film 60. Other parts of the structure are identical to those of the sixth embodiment.

The semiconductor device 7 according to the present embodiment is formed, for example, by forming the stacked body 20 and the lower layer insulating film 60 similarly in the third embodiment, and thereafter forming the contact plugs 31 by dry etching at the same time as the contact plugs 30.

In the present embodiment explained above, the difference in the depths between the contact plugs 30 connected to the conductive layers 21 and the contact plugs 31 connected to the memory films 70 can be reduced. Since this enables these contact plugs to be formed at the same time, the process time can be shortened and the manufacturing cost can be reduced.

Modification

Figure 19:
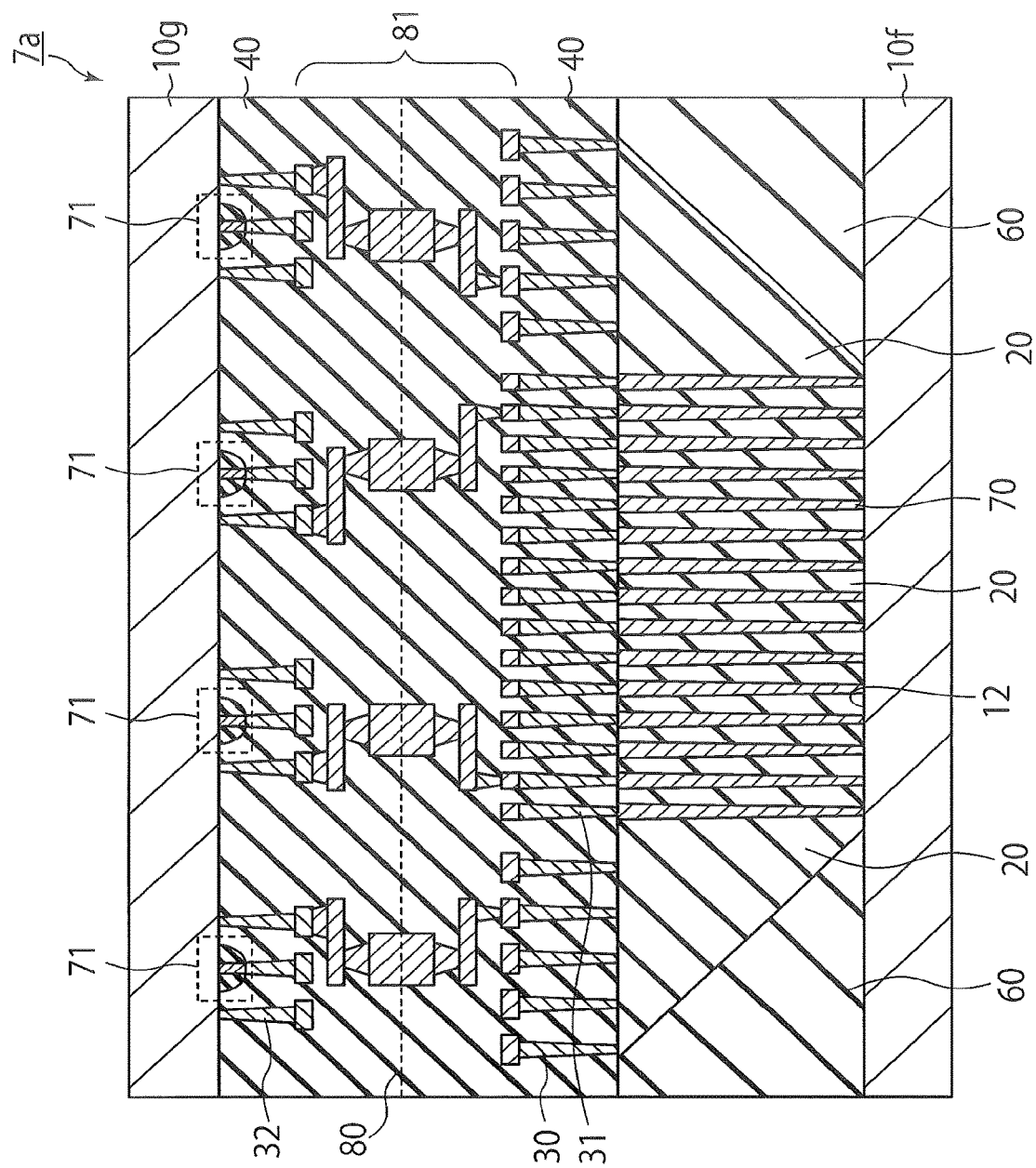
FIG. 19 is a sectional view illustrating a structure of relevant parts of a semiconductor device according to a modification of the seventh embodiment.

FIG. 19 is a sectional view illustrating a structure of relevant parts of a semiconductor device according to a modification of the seventh embodiment. Features of the modification that are different from the seventh embodiment are mainly described below.

In a semiconductor device 7a according to the present modification, while the stacked body 20, the lower layer insulating film 60, and the metal films 70 are formed on the substrate 10f, the MOS transistors 71 are formed on a substrate 10g. The MOS transistors 71 and the memory films 70 are connected to each other via metallic wiring layers 81 joined on a bonding surface 80.

According to the present modification explained above, the MOS transistors 71 are formed on a substrate different from a substrate on which the memory films 70 are formed, which can improve the integration of memory cells.

Eighth Embodiment

Figure 20:
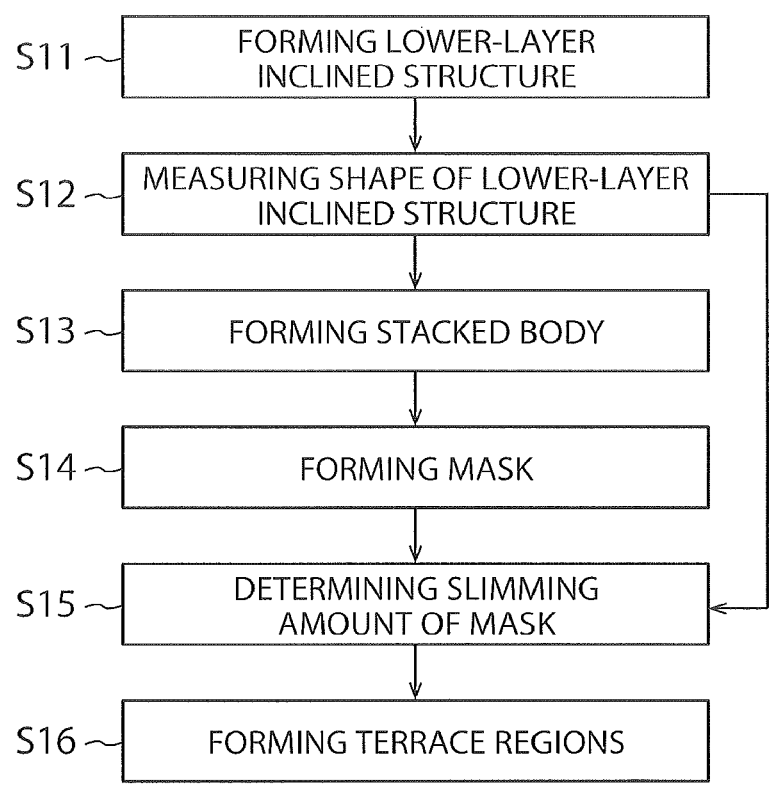
FIG. 20 is a flowchart of a main manufacturing process of a semiconductor device according to an eighth embodiment.

FIG. 20 is a flowchart of a main manufacturing process of a semiconductor device according to an eighth embodiment. In the present embodiment, a silicon dioxide film is formed as the lower layer insulating film 60 on the substrate 10*b* and thereafter the lower layer inclined structure 61 is formed by wet etching using a resist (Step S11) similarly in the third embodiment.

Figure 21:
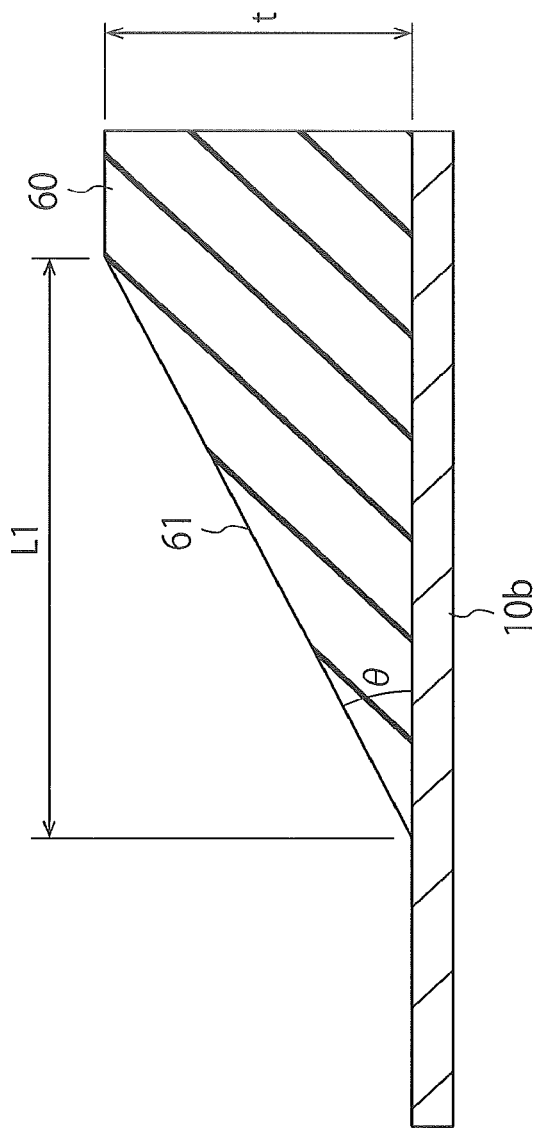
FIG. 21 is a sectional view explaining a measuring method of an inclination angle of a lower layer insulating film.

Next, the shape of the lower layer inclined structure 61 is measured (Step S12). At Step S12, for example, as illustrated in FIG. 21, the inclination angle θ of the lower layer insulating film 60 is measured by measuring a distance L1 between the top end and the bottom end of the inclined surface of the lower layer insulating film 60, and a film thickness t of a remaining region of the lower layer insulating film 60. The inclination angle θ can be measured using a laser microscope, a stylus profiler, an atomic force microscope, or the like.

Next, as explained in the first embodiment, the stacked body 20*a* including the insulating layers 22 and the sacrifice layers 23 alternately stacked is formed (Step S13), and the mask material 50 is subsequently formed (Step S14). Next, the opening 51 is formed on the mask material 50. Subsequently, a portion of an uppermost sacrifice layer 23 and a portion of an insulating layer 22 formed thereunder are removed by dry etching. Subsequently, slimming of the end of the mask material 50 and removal of a sacrifice layer 23 and an insulating layer 22 are repeated, thereby forming terrace regions in the sacrifice layers 23.

Figure 22A:
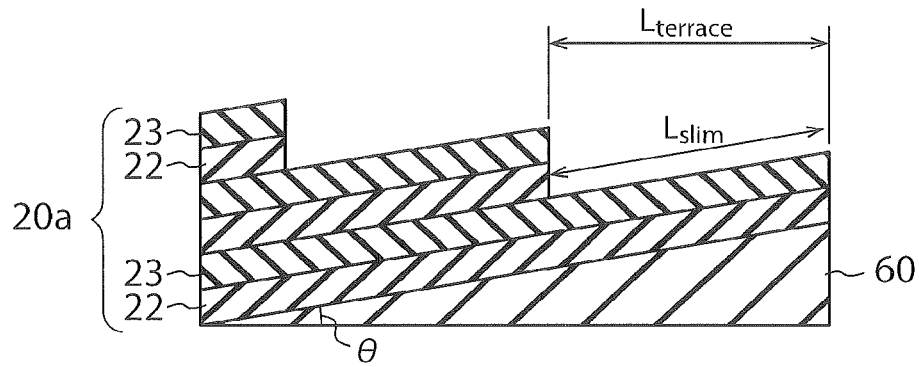
FIG. 22A is a conceptual diagram of terrace regions formed on an inclined surface of a lower layer insulating film.

FIG. 22A is a conceptual diagram of terrace regions formed on an inclined surface of the lower layer insulating film 60. Since the slimming of the mask material 50 progresses along the inclined surface of the lower layer insulating film 60, the formed terrace length Lterrace has the following relation with the slimming length Lslim of the mask material 50 and the inclination angle θ of the lower layer insulating film 60.

$$L\text{terrace} = L\text{slim} \times \cos\theta \quad (2)$$

Figure 22B:
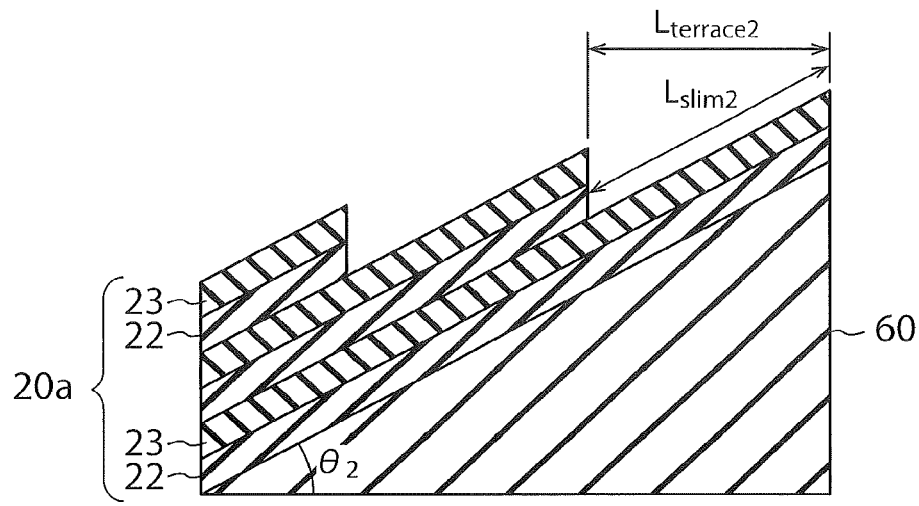
FIG. 22B is a conceptual diagram of terrace regions formed on an inclined surface of an actually formed lower layer insulating film.

At this time, in a case in which there is a difference between the desired inclination angle θ and an actually formed inclination angle θ2 as illustrated in FIG. 22B, there is assumed a situation in which a difference is produced between the desired terrace length Lterrace and a formed terrace length Lterrace2 and the contact plugs 30 formed thereafter cannot be connected to the desired terrace regions if the terrace regions are formed with the same slimming length Lslim.

In order to solve this problem, a slimming length Lslim2 to form the desired terrace length Lterrace is calculated based on the measured inclination angle θ2 (Step S15), and the terrace regions are formed (Step S16) in the present embodiment.

Figure 23A:
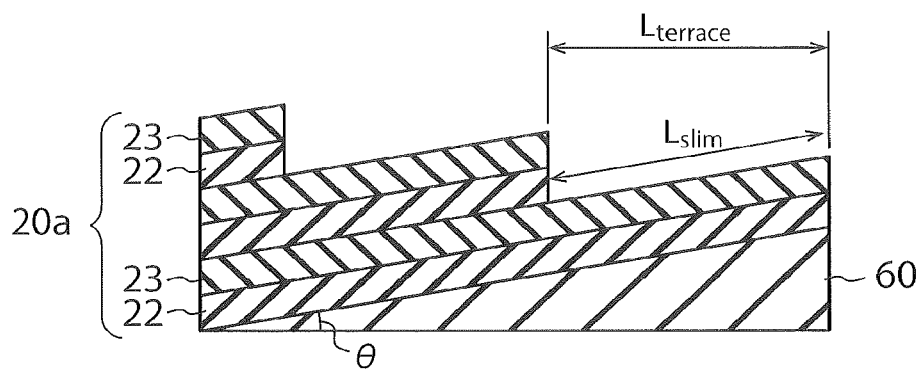
FIG. 23A is a conceptual diagram of an inclined surface of a lower layer insulating film with a desired inclination angle.
Figure 23B:
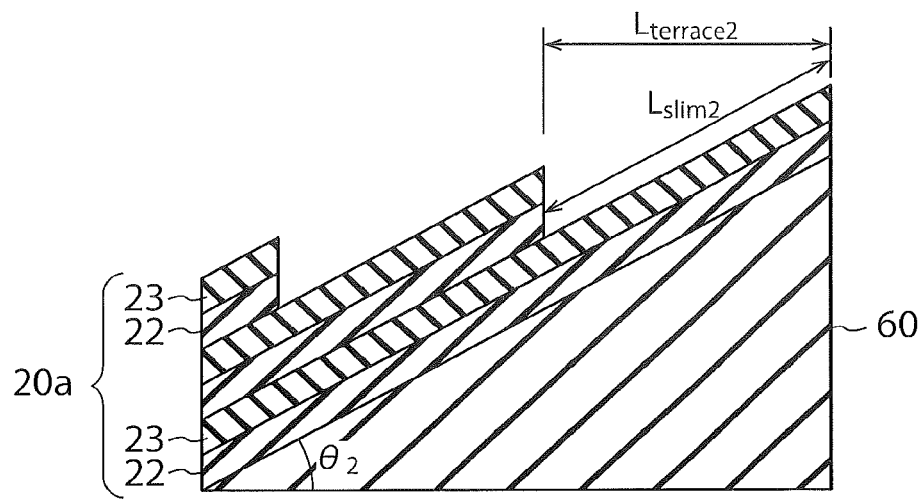
FIG. 23B is a conceptual diagram of an inclined surface of a lower layer insulating film with an actual inclination angle.

As illustrated in FIGS. 23A and 23B, even in a case in which there is a difference between the desired inclination angle θ and the actually formed inclination angel θ2, a difference between the desired terrace length Lterrace and the formed terrace length Lterrace2 is suppressed and problems such as a connection failure of the contact plugs 30 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a stacked body including a plurality of conductive layers and a plurality of insulating layers alternately stacked on the substrate; and
   a plurality of first contact plugs individually connected to the conductive layers on an end of the stacked body, wherein
   a lower layer three-dimensional structure comprising any of a lower layer inclined structure continuously inclined upward with respect to a flat surface of the substrate, and a lower layer composite stepped structure in which planes parallel to the flat surface and slopes inclined the upward with respect to the flat surface are alternately continuous is included on the substrate, and
   at least some of terrace regions being connection regions to the first contact plugs on top surfaces of the conductive layers are located on the lower layer three-dimensional structure, and
   at least a portion of the terrace regions has an obliquely formed top surface of the conductive layers and a vertically formed end surface of the conductive layers, and
   the first contact plugs are connected to the obliquely formed top surface of the conductive layers, and
   in the lower layer inclined structure, there is a difference in height of connection portions between the first contact plugs and the terrace regions, and there is a difference in length among the first contact plugs, and
   in the lower layer inclined structure, a first contact plug connected to an uppermost conductive layer is longer than a first contact plug connected to a lowermost conductive layer.

2. The device of claim 1, wherein the lower layer three-dimensional structure is provided on a surface of the substrate.

3. The device of claim 2, wherein
   the substrate is a silicon substrate, and
   an inclined surface of the lower layer inclined structure or an inclined surface of the lower layer composite stepped structure is a (111) plane of silicon crystal.

4. The device of claim 1, further comprising an insulating film on the substrate, wherein
   the lower layer inclined structure is provided on a surface of the insulating film.

5. The device of claim 1, wherein number of steps in the lower layer stepped structure is equal to or less than half of number of the conductive layers.

6. The device of claim 1, wherein a difference in depths between a contact plug connected to an uppermost conductive layer and a contact plug connected to a lowermost conductive layer is equal to or smaller than half of a height of the stacked body.

7. The device of claim 1, further comprising:
a memory film penetrating through the stacked body;
a second contact plug connected to the memory film;
a circuit configured to drive the memory film; and
a third contact plug connected to the circuit, wherein
a top part of the second contact plug or a top part of the third contact plug is coplanar with top parts of the first contact plugs.

* * * * *